(12) United States Patent
McRay (10) Patent No.: US 8,198,610 B2
(45) Date of Patent: Jun. 12, 2012

(54) ION IMPLANTER WITH VARIABLE APERTURE AND ION IMPLANT METHOD THEREOF

(75) Inventor: Richard F. McRay, Salem, MA (US)

(73) Assignee: Advanced Ion Beam Technology, Inc., San Jose, CA (US)

(\*) Notice: Subject to any disclaimer, the term of this patent is extended or adjusted under 35 U.S.C. 154(b) by 296 days.

(21) Appl. No.: 12/582,140

(22) Filed: Oct. 20, 2009

(65) Prior Publication Data

US 2011/0089334 A1    Apr. 21, 2011

(51) Int. Cl.
*G21K 5/10* (2006.01)
*H01J 37/02* (2006.01)

(52) U.S. Cl. ............................ 250/492.21; 250/492.3

(58) Field of Classification Search ..... 250/492.1–492.3
See application file for complete search history.

(56) References Cited

U.S. PATENT DOCUMENTS

| | | | | |
|---|---|---|---|---|
| 3,922,698 | A | * | 11/1975 | Petersen ..................... 396/468 |
| 4,143,273 | A | * | 3/1979 | Richey et al. ..................... 378/7 |
| 6,207,964 | B1 | * | 3/2001 | McIntyre et al. ........ 250/492.21 |
| 7,714,308 | B2 | * | 5/2010 | Hiroshima ............... 250/492.23 |
| 2002/0066872 | A1 | * | 6/2002 | Nishihashi et al. ...... 250/492.21 |
| 2002/0121613 | A1 | * | 9/2002 | Scheuer et al. ............ 250/492.1 |

\* cited by examiner

*Primary Examiner* — David A Vanore
*Assistant Examiner* — David E Smith
(74) *Attorney, Agent, or Firm* — Stout, Uxa, Buyan & Mullins, LLP (57) ABSTRACT

An ion implanter and an ion implant method are disclosed. The ion implanter has an aperture assembly with a variable aperture and is located between an ion source of an ion beam and a holder for holding a wafer. At least one of the size and the shape of the variable aperture is adjustable. The ion beam may be flexibly shaped by the variable aperture, so that the practical implantation on the wafer can be controllably adjusted without modifying an operation of both the ion source and mass analyzer or applying a magnetic field to modify the ion beam. An example of the aperture assembly has two plates, each having an opening formed on its edge such that a variable aperture is formed by a combination of these openings. By respectively moving the plates, the size and the shape of the variable aperture can be changed.

19 Claims, 10 Drawing Sheets

ION IMPLANTER WITH VARIABLE APERTURE AND ION IMPLANT METHOD THEREOF

BACKGROUND OF THE INVENTION

1. Field of the Invention

The present invention generally relates to an ion implanter, and more particularly, relates to an ion implanter having a variable aperture capable of flexibly shaping an ion beam before a wafer is implanted.

2. Description of the Prior Art

Figure 1A:
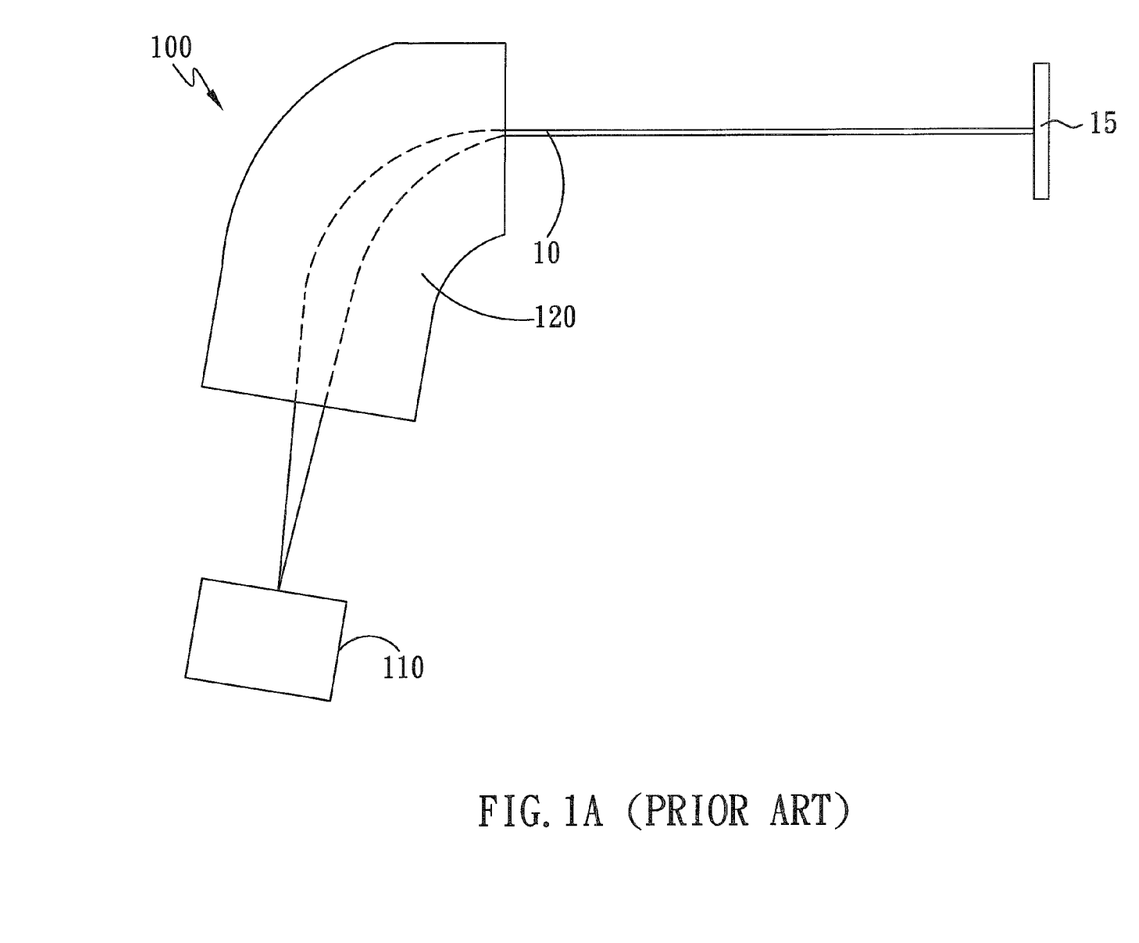
FIG. 1A to FIG. 1C are sectional views of conventional implanters.

FIG. 1A is a sectional view for a conventional implanter 100. The conventional implanter 100 has at least an ion source 110, a mass analyzer 120, and a holder (not shown). The ion source 110 is capable of providing an ion beam 10. The mass analyzer 120 is capable of analyzing the ion beam 10 so that the ions with un-desired charge-to-mass ratios are moved away from the ion beam 10. After that, the ion beam 10 with required ions is implanted into the wafer 15 held by the holder.

As usual, the ion beam 10 outputted from the mass analyzer 120 is not as perfect as required. For example, the shape (the cross-sectional shape) of the ion beam 10 may be irregular or the ion beam current distribution among/along the cross-section of the ion beam 10 may be non-uniform. Therefore, an optimal or popularly required ion beam is not properly provided. This is true for both types of beams typically required, the spot ion beam and the ribbon ion beam.

Figure 1B:
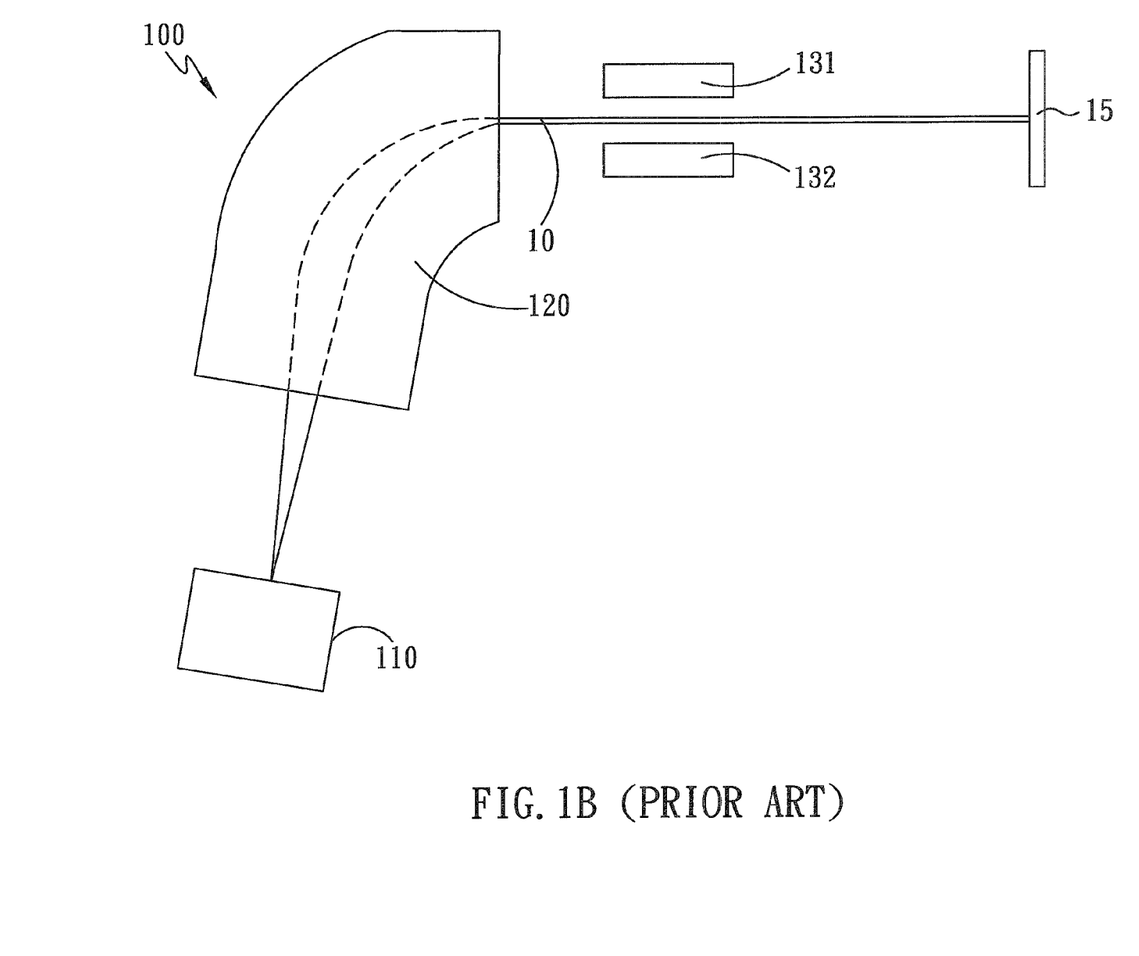

Some prior art approaches, such as shown in FIG. 1B, improve on the disadvantage by applying at least one magnetic field between the mass analyzer 120 and the holder (or the wafer 15), such that the motion trajectories of ions of the ion beam 10 are adjusted by the interaction between the ions and the magnetic field. For example, the first bar magnet 131 and the second bar magnet 132 can be used to apply the magnetic field on the ion beam 10 before the wafer 15 is implanted. Reasonably, the ion beam 10 may be effectively shaped by properly adjusting the magnetic field. Different portions of the original ion beam 10 may have different deformations induced by the applied magnetic field, and the ion beam current distribution of the shaped ion beam 10 may be changed.

However, the method for adjusting the ion beam 10 by applying a magnetic field is difficult and complicated. The adjusted result is improved when the applied number of magnetic fields is increased. However, the cost and the difficulties also are correspondingly increased. Moreover, different portions of the ion beam 10 almost cannot be separately adjusted, because the magnetic field provided by a given magnet will be continuously distributed over the space.

Figure 1C:
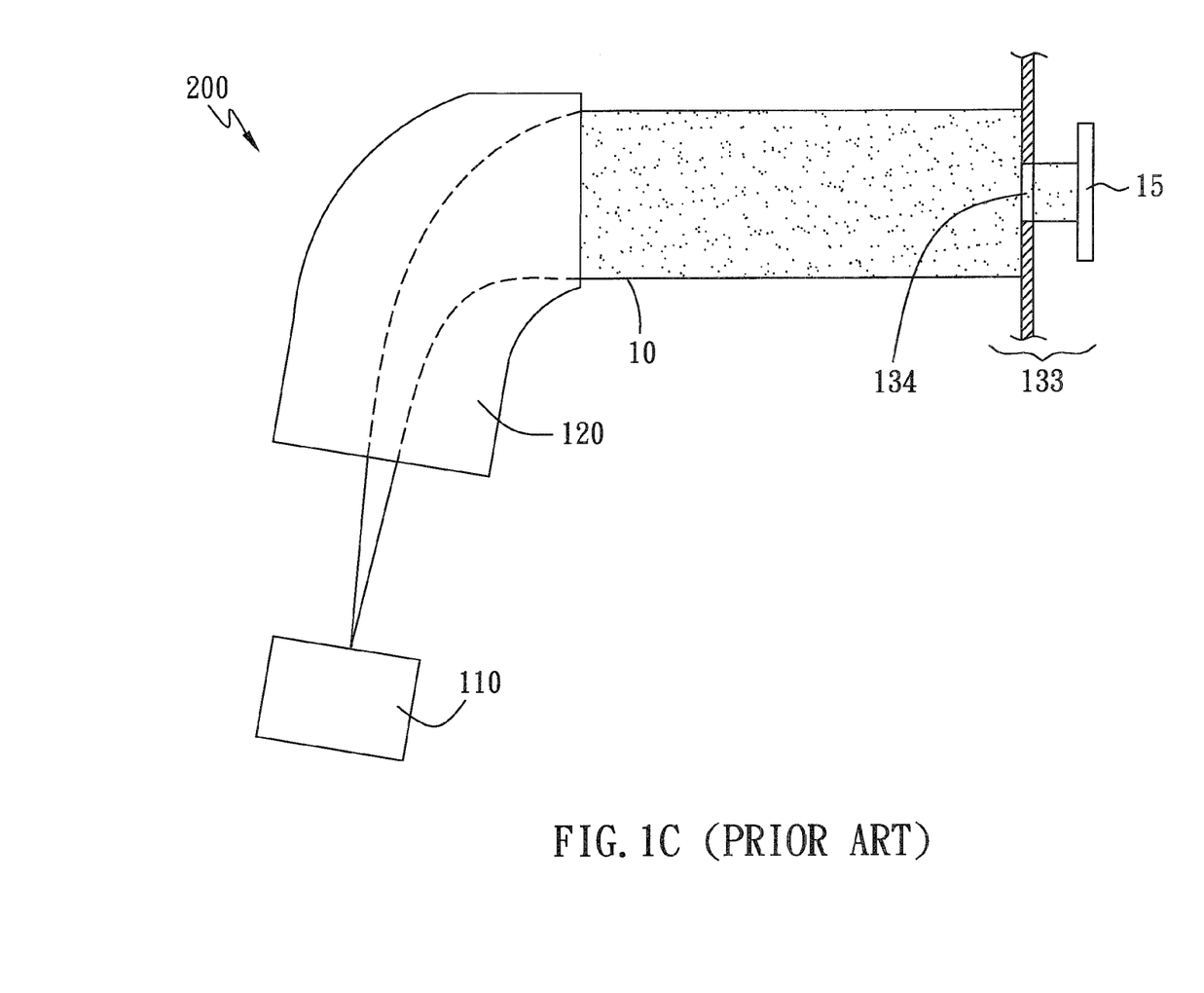

Another prior art approach, such as shown in FIG. 1C, improves on the disadvantage by locating a plate 133 having a fixed aperture 134 between the mass analyzer 120 and the holder (or the wafer 15), such that only a portion of the ion beam 10 can pass through the fixed aperture 134 and be implanted into the wafer 15. Reasonably, when the plate 133 with fixed aperture 134 is properly selected to have a specific shape/size of the fixed aperture 134, the shape of the implanted ion beam 10 may be suitably changed. Moreover, by adjusting the relative geometric relation between the fixed aperture 134 and the ion beam 10, only a specific portion of the ion beam 10 with a specific ion beam current distribution can be implanted into the wafer 15.

However, the plate 133 with the fixed aperture 134 can only passively select a portion of the ion beam 10, especially when selection of a portion with a specific shape and size is needed. Hence, the potential improvement of ion beam 10 using this method may be limited. Moreover, when the required adjustments of the ion beam vary over a wide range, numerous plates 133 with different fixed apertures 134 are needed to provide the required adjustment freedom. Hence, the associated high cost of numerous plates 133 with different fixed apertures 134 and complex operations for replacing different plates 133 become unavoidable.

Because of disadvantages associated with prior art approaches as mentioned above, there is a need to find a novel ion implanter and a novel method for adjusting the ion beam effectively and economically.

SUMMARY OF THE INVENTION

The invention locates an aperture assembly between the ion source capable of providing an ion beam and a holder capable of holding the wafer. The aperture assembly has a variable aperture and is capable of adjusting at least a size and/or a shape of the variable aperture. Hence, by properly adjusting the variable aperture, the ion beam may be flexibly shaped. For example, according to the practical condition of the ion beam and/or the required values of implantation parameters, the variable aperture can be flexibly adjusted to allow only a specific shaped ion beam with a specific shape, a specific size and a specific ion beam current distribution to be implanted into the wafer.

As an example, the aperture assembly may have at least two plates with each having an opening located on its edge and corresponding to a portion of the variable aperture. Hence, by respectively moving the plates, especially by respectively moving different plates along different directions, both the size and the shape of the variable aperture may be adjusted.

Note that the aperture assembly with flexible aperture can be located in many positions inside the implanter. Indeed, it only need be located behind the ion source providing the ion beam and before the wafer being implanted. For example, it can be located between the ion source and the mass analyzer; it even can be located inside the mass analyzer. There are two reasons for the position flexibility. First, the existence of the proposed aperture assembly will not affect the operation of other portions of the implanter, because it is a mechanical device and will not affect its neighboring components/functions. Second, the shape and the size of the variable aperture can be flexibly adjusted through a wide range, and the requirement of using different aperture assemblies is significantly less than the requirement of using the conventional plate with fixed aperture.

One embodiment is an ion implanter comprising an ion source, a holder and an aperture. The ion source is capable of providing an ion beam, and the holder is capable of holding a wafer to be implanted. The aperture assembly is located between the ion source and the holder (or the wafer) and has a variable aperture capable of shaping the ion beam before the wafer is implanted. Herein, at least a size and shape of the variable aperture can be adjusted.

Another embodiment is an ion implant method, which can comprise, first, providing a wafer and an ion beam. Then, it can comprise operating an aperture assembly so that at least size and shape of a variable aperture of the aperture assembly are adjustable. Herein, the variable aperture can shape the ion beam before the wafer is implanted.

The aperture assembly can be a simple mechanical device. For example, each of at least two plates has an opening on its edge and is capable of being respectively moved. Therefore, the variable aperture may be flexibly adjusted by only changing the relative geometric relations among the plates. Accordingly, in comparison with the well-known prior art, the invention can effectively and economically adjust the ion beam to be implanted.

In addition, according to another embodiment which may more effectively adjust the ion beam, the aperture assembly with variable aperture and magnets (e.g., the mentioned conventional magnets) for applying magnetic field(s), can be located in sequence to adjust the ion beam simultaneously.

DETAILED DESCRIPTION OF THE INVENTION

A detailed description of the present invention will be discussed with reference to the following exemplary embodiments, which are not intended to limit the scope of the present invention and can be adapted for other applications. While the drawings are illustrated in detail, it is appreciated that quantities of components are unlimited and may be greater or less than that disclosed.

Figure 2A:
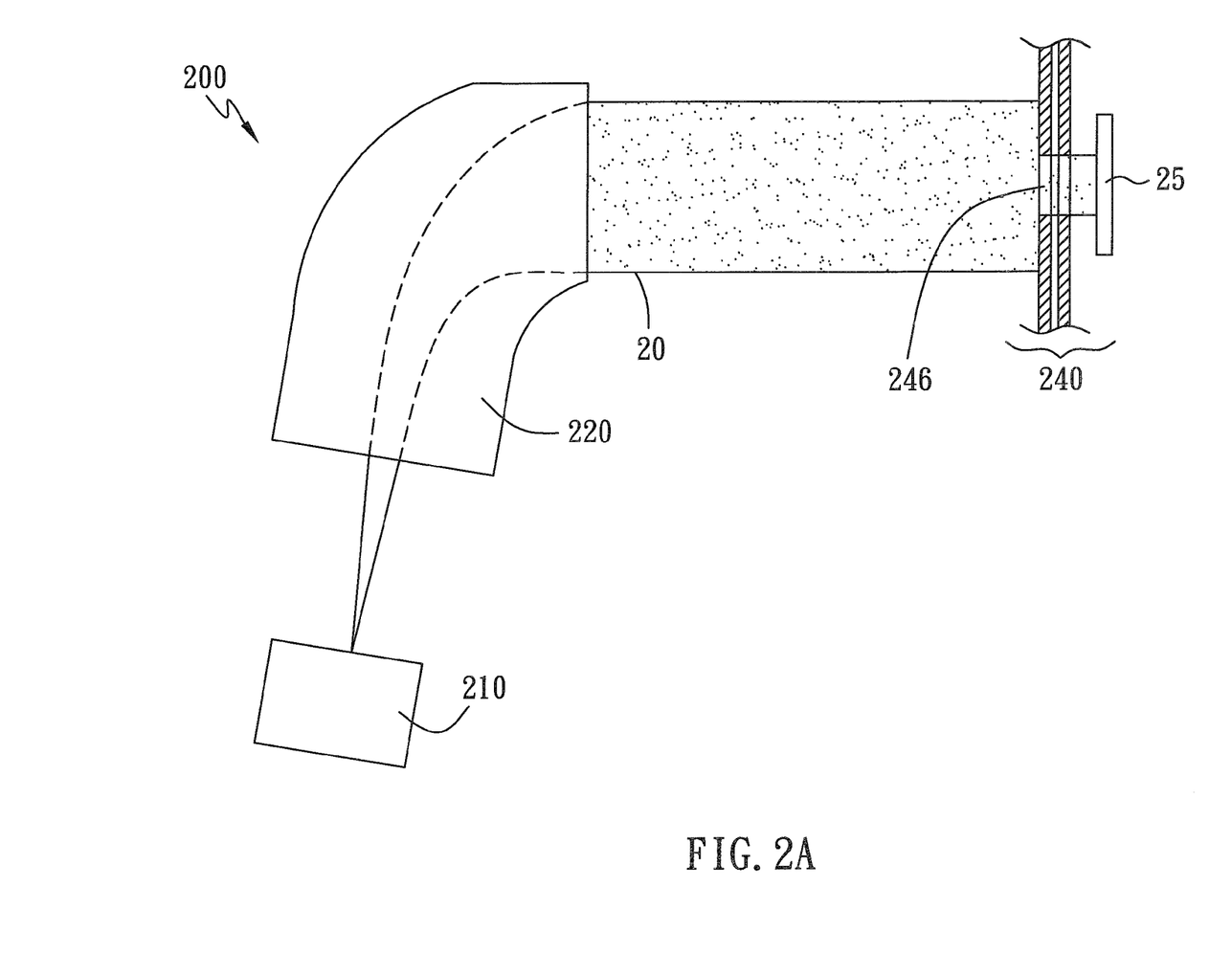
FIG. 2A is a sectional view of an ion implanter in accordance with an embodiment of the present invention.

FIG. 2A shows a sectional view of an ion implanter 200 in accordance with an embodiment of the present invention. The ion implanter 200 comprises an ion source 210, a mass analyzer 220, and an aperture assembly 240. The ion source 210 is capable of providing an ion beam 20, and the mass analyzer 220 is capable of analyzing the ion beam 20. The aperture assembly 240 has a variable aperture 246 and is capable of adjusting the variable aperture 246 to control size and shape of the ion beam 246, such that the ion beam 20 is shaped before a wafer 25, usually held by a holder (not shown), is implanted by the ion beam 20.

Significantly, by comparing FIG. 2A with FIG. 1C, a main characteristic of the embodiment can be discerned as the presence of the aperture assembly 240. In the prior art, the structure of the plate 133 is fixed, meaning the fixed aperture 134 of the plate 133 must have a fixed shape and size. Hence, with the exception of rotating and/or moving the plate 133 to change the relative geometric relation between the fixed aperture 134 and the ion beam 10, the size and shape of shaped ion beam 10 are fixed. Moreover, when modification of the size/shape of the fixed aperture 134 is thus restricted, so too is the available variable range of shape/size of the shaped ion beam. That is, modification of the shaped ion beam by rotating and/or moving the plate 133 is commensurately limited. Therefore, if it is necessary to change the size and/or shape of the shaped ion beam 10, the prior art usually has to replace an original plate 133 having an original aperture 134 with a new plate 133 having a new aperture 134, especially when the required change is larger than the available variable range provided by rotating and/or moving the plate 133. Examples calling for changing of the size/shape of the shaped ion beam include those in which a non-uniform implantation over the wafer 25 is required or different ion beam currents of the shaped ion beam 20 are required to implant different wafers 25.

In contrast to that of FIG. 1C, the structure of the aperture assembly 240 in FIG. 2A is not fixed, and both the shape and the size of the variable aperture 246 can be flexibly adjusted in a variable range. Therefore, changing the size and/or shape of the shaped ion beam 20 can be accomplished using the same aperture assembly 240 whereby replacement thereof with a new aperture assembly 240 is not necessary, even when the required change is larger than the available variable range provided by rotating and/or moving the aperture assembly 240. Accordingly, in the embodiment, the size/shape of the shaped ion beam 20 can be adjusted by only adjusting the variable aperture 246, owing to both the size and the shape of the variable aperture 246 being readily adjustable. In other words, when a specific size/shape of the shaped ion beam 20 is desired or required and/or the shape/size of the variable aperture 246 must be changed, in the embodiment, the location of the aperture assembly 240 nonetheless may be, or may remain, fixed with only the variable aperture 246 being adjusted (e.g., from a first shape/size to a second shape/size).

Of course, to more flexibly adjust the shaped ion beam 20, the embodiment also can move the aperture assembly 240 along a first direction intersecting the ion beam 20 and/or rotate the aperture assembly 240 along a second direction intersecting the ion beam 20. Herein, according to a feature of the invention, the only limitation can be that the relative geometric relation between the variable aperture 246 and the ion beam 20 being changed, such that the size/shape of the shaped ion beam can be correspondingly changed. Hence, the first direction and the second direction can be almost any direction, except the direction parallel to the direction of ion beam 20 when ion beam 20 just intersects the aperture assembly 240.

Figure 2B:
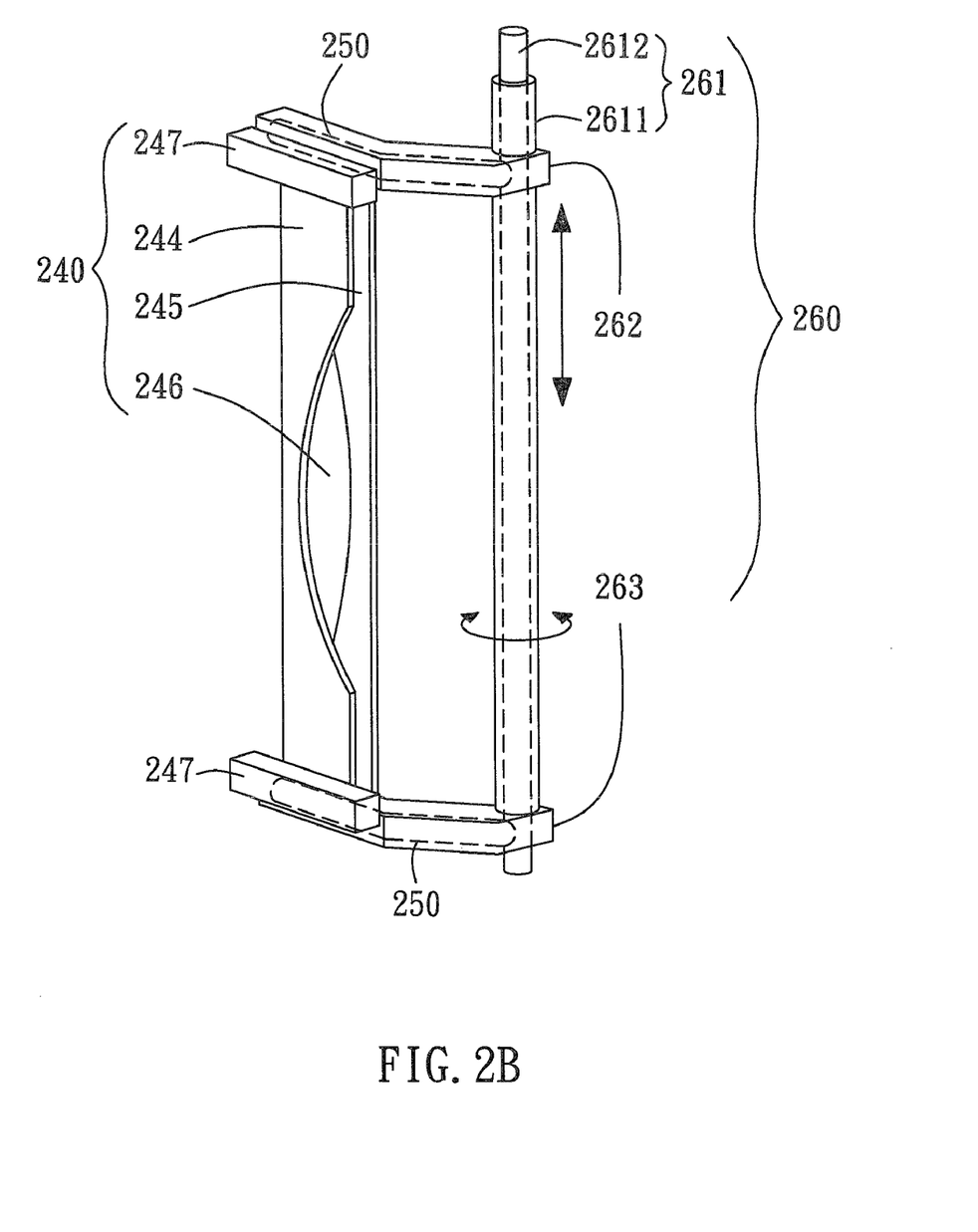
FIG. 2B to FIG. 2D are perspective views of both the aperture assembly shown in FIG. 2A and the corresponding aperture driving assembly in accordance with embodiments of the present invention.
Figure 2C:
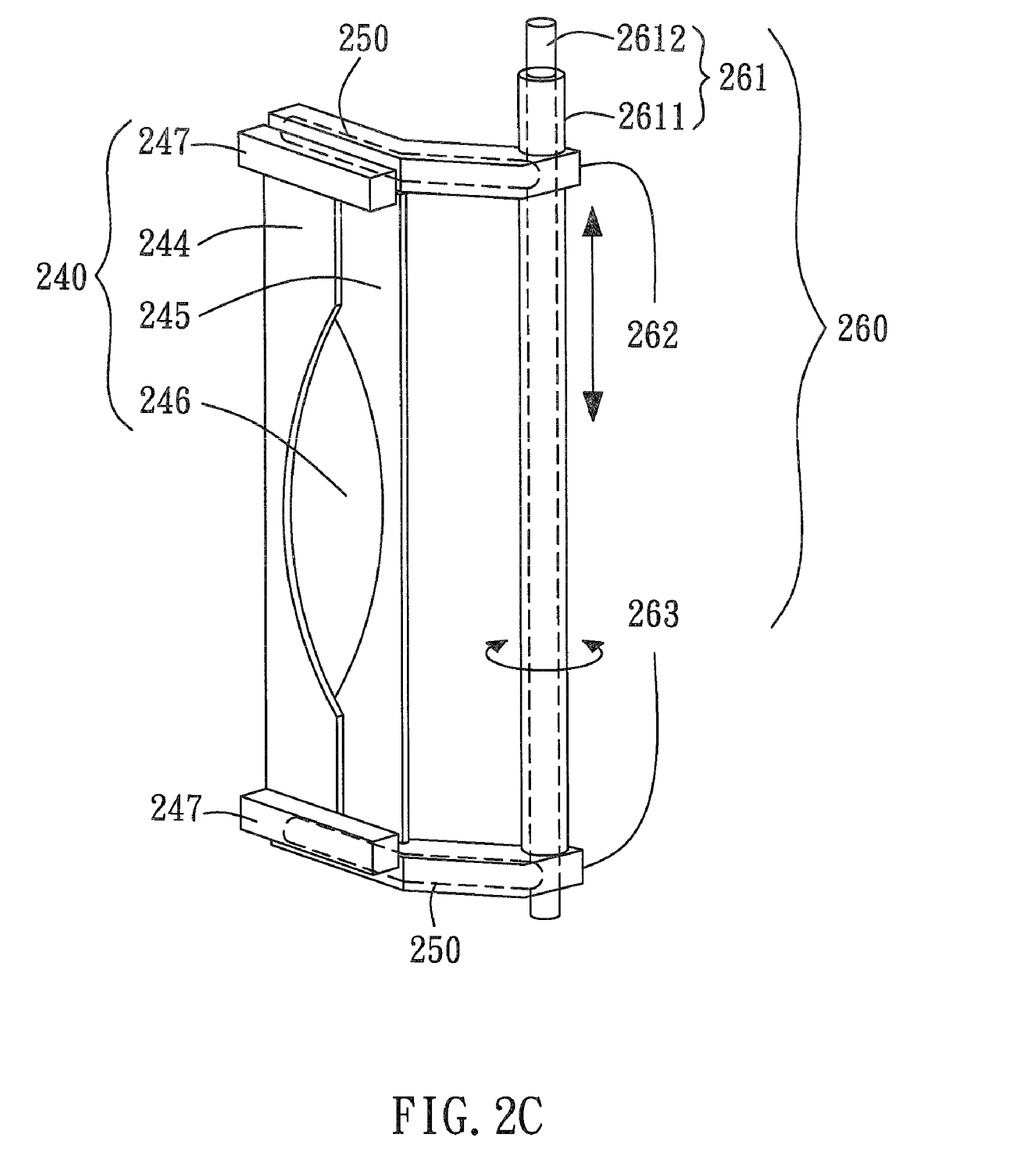
Figure 2D:
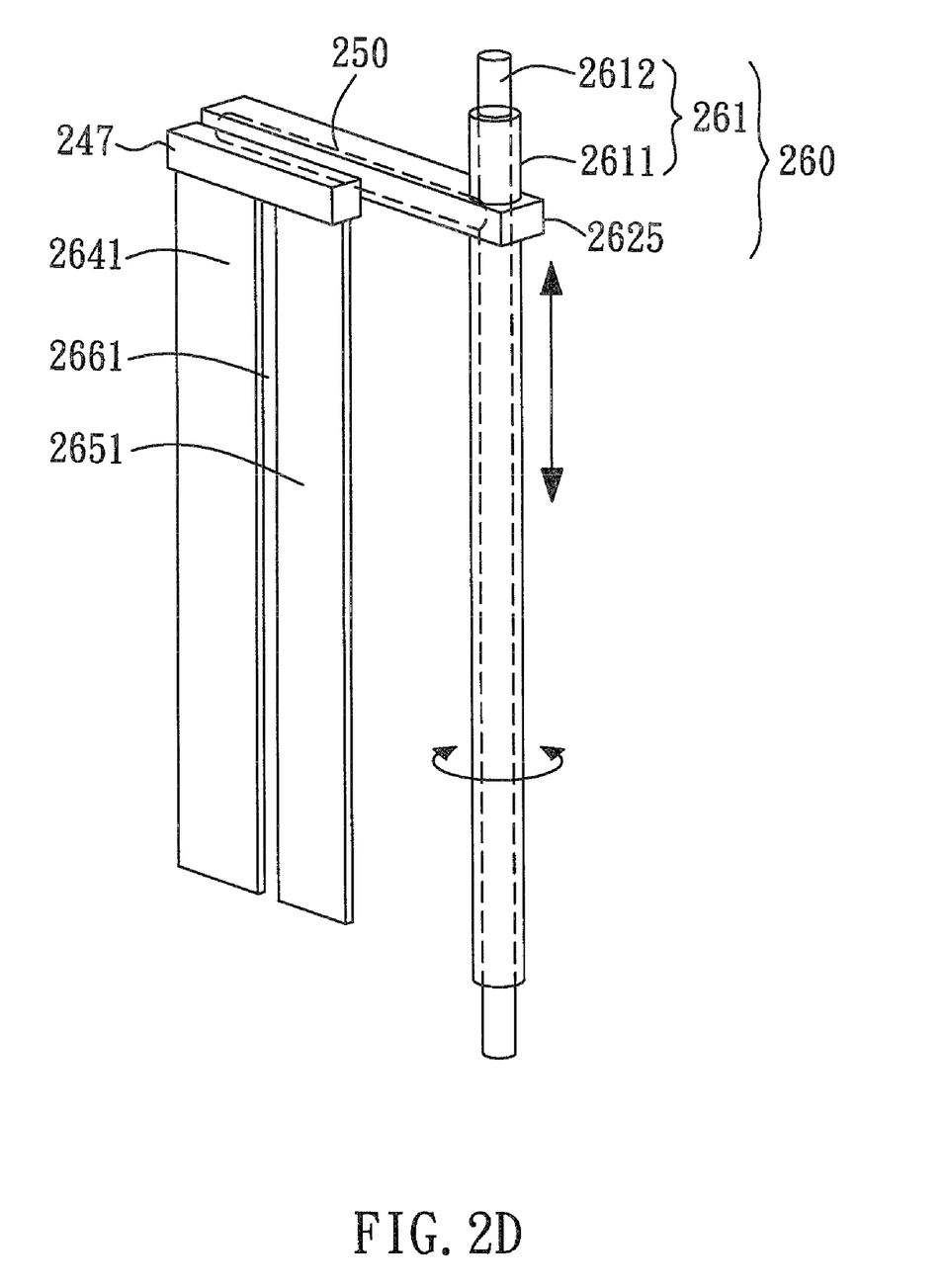

FIG. 2B to FIG. 2D show with perspective views exemplary implementations of the aperture assembly 240 of FIG. 2A and the corresponding aperture driving assembly 260. Referring to FIG. 2B, the aperture driving assembly 260 comprises a shaft 261 and first/second arms 262/263 that couple (e.g., hold, attach, or fix) the aperture assembly 240 thereto. By use of the shaft 261, the aperture assembly 240 can be moved (e.g., up and down along the shaft 261) along a specific direction different than the direction of ion beam 20, and the aperture assembly 240 also can be rotated around the shaft 261.

As movement and/or rotation of the plate 133 with fixed aperture 134 is well-known, the same technology can be used to move/rotate the aperture assembly 240. For example, as shown in FIG. 2C, the shaft 261 may be a combination of an outer shaft 2611 and an inner shaft 2612, with the outer shaft 2611 being concentrically located with respect to the inner shaft 2612. The aperture assembly 240 is directly attached on both the first arms 262 and the second arms 263 which are directly fixed on the outer shaft 2611. The aperture assembly 240 can be rotated and translated when the outer shaft 2611 is driven to rotate or move longitudinally. Extending and/or retracting of the inner shaft 2612 relative to outer shaft 2611 can be used via the driving mechanism 250 to drive the plates 244 and 245 in opposite directions, thereby opening or closing aperture 246 formed by those plates. Moreover, the driving mechanism 250 is located inside both the shaft 261 and the arms 262/263 and is used to drive the plates 244/245. For example, the driving mechanism 250 is mechanically coupled with the inner shaft 2612, such that the motion of the inner shaft 2612 can be used to drive the plates 244/245.

Although the plates 244 and 245 are shown respectively fixed on the first arm 262 and the second arm 263 in both FIG. 2B and FIG. 2C, the invention allows the number of plates to differ from the number of the arms. Furthermore, although the plates 244 and 245 are shown having openings (e.g., along their edges) for forming the variable aperture 246 in both FIG. 2B and FIG. 2C, the invention allows the plate(s) to have no opening but instead/additionally to directly use straight edge (s) to form the variable aperture. For example, as shown in FIG. 2D, two plates 2641 and 2651 are attached to the same arm 2625. Indeed, the only limitation is that different plate(s), even different portions of the aperture assembly 240, can be moved along the used arm(s) respectively to adjust at least shape and size of the variable aperture 246. Here, there is no opening on the opposite edges of the two plates 2641 and 2451, such that the shape of the variable aperture 2661 is essentially rectangular.

Figure 2E:
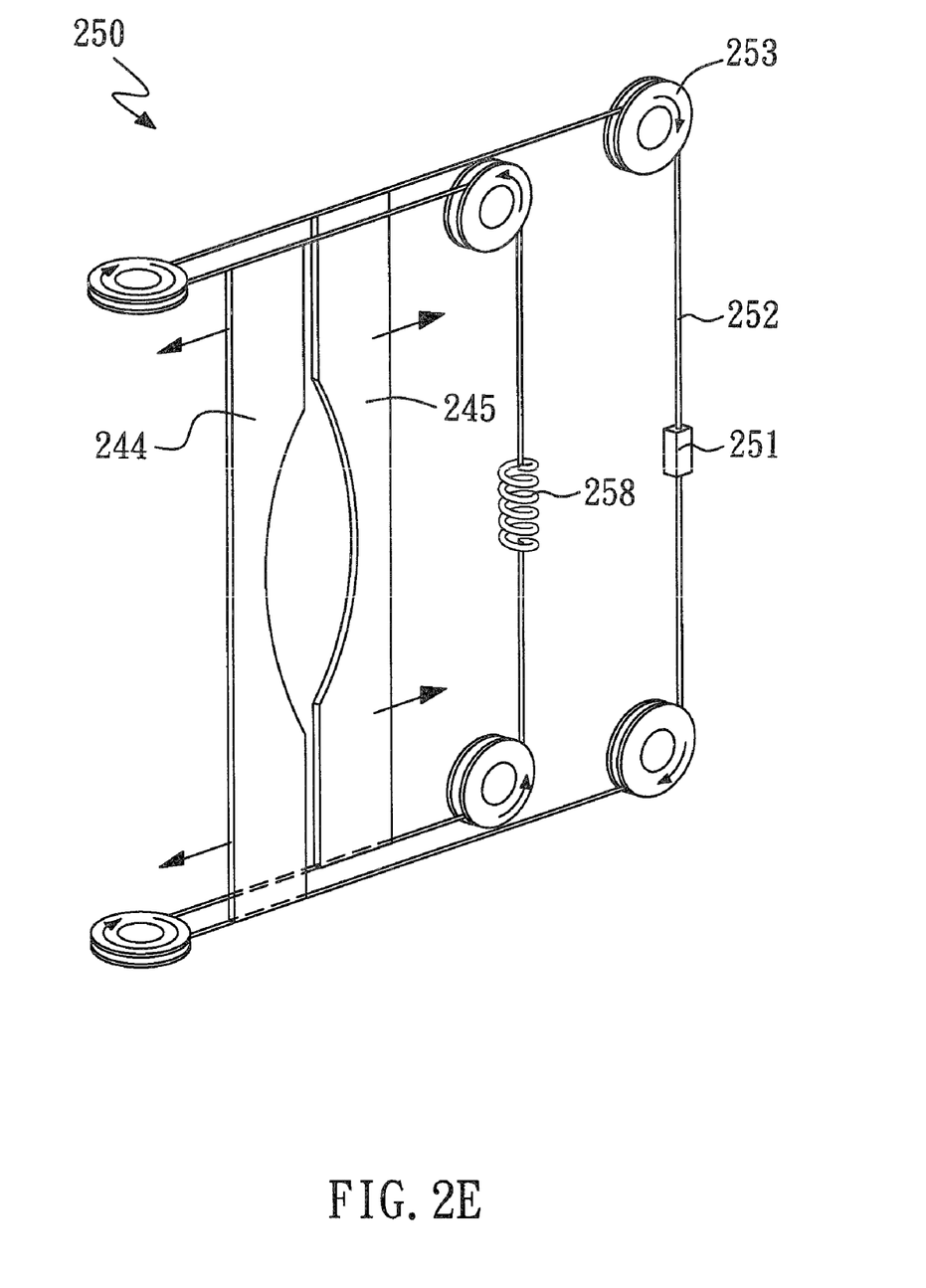
FIG. 2E is an example of a driving assembly for adjusting the aperture assembly shown in FIG. 2C in accordance with an embodiment of the present invention.

FIG. 2E shows one possible driving mechanism 250 for moving plates 244 and 245 in which the block 251 is mechanically connected to the inner shaft 2612 concentric with the outer shaft 2611 (FIG. 2D). When the inner shaft 2612 is translated longitudinally inside the outer shaft 2611, the block 251 is driven to move the cable connected to plates 244 and 245, causing them to move in opposite directions. The pulleys 253 are mounted inside arms 262 and 263 and are assembled to move with the drive assembly 260 (FIGS. 2B and 2C). Spring 258 keeps the cable under tension to effect accurate movement. Other mechanisms are also possible; for example, a driving mechanism can use racks 2D) to drive a rack. Here, the power source for controlling the motions of the inner shaft 2612 and outer shaft 2611 is typically located outside of the implantation chamber with appropriate vacuum seals being provided for both the inner shaft 2612 and the outer shaft 2611 (FIG. 2D).

Figure 2F:
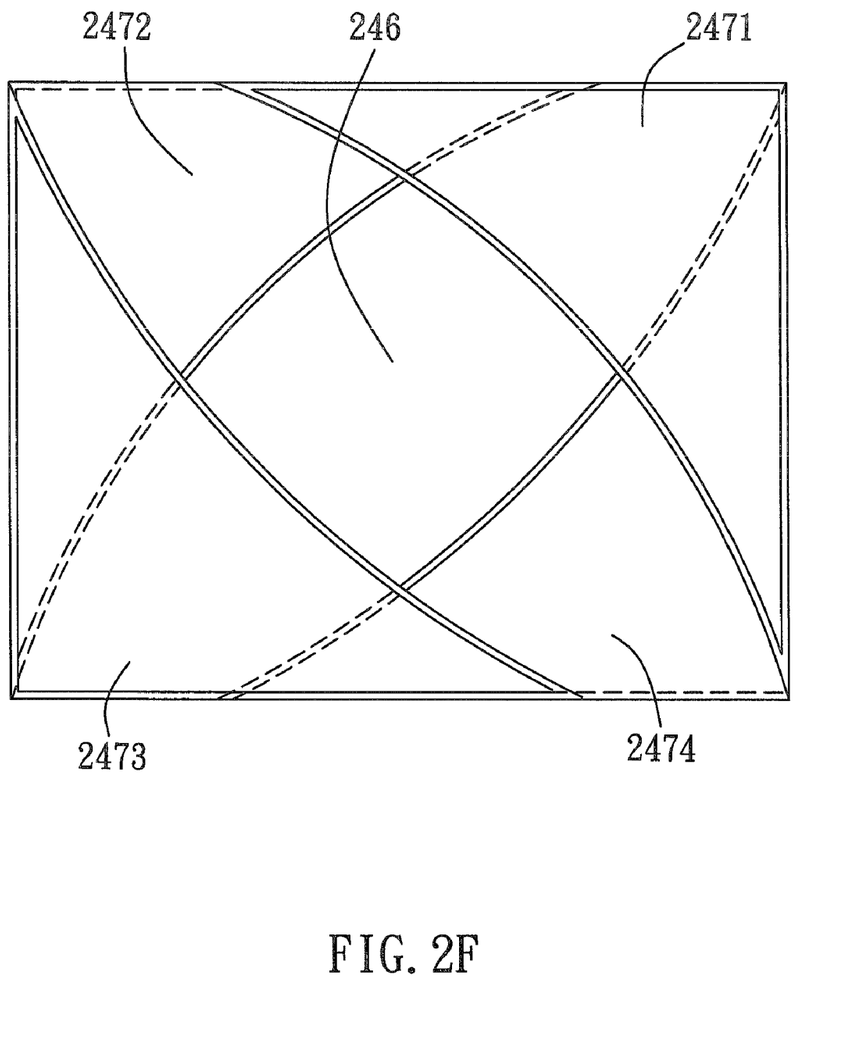
FIG. 2F is an example of the perspective view of the aperture assembly shown in FIG. 2A in accordance with an embodiment of the present invention.

Note that the invention is limited neither to the shape nor formation technique of the variable aperture 246. Although opposite small arcs are shown being used to define the shape of the variable aperture 246 in FIG. 2B and FIG. 2C, other shapes may also be used for this invention. For example, as shown in FIG. 2D, the variable aperture 2661 can be formed by a combination of two plates 2641 and 2651 where each has no opening (concavity) on its edge but rather use a linear edge to define a portion of the variable aperture 2661. As another example, as shown in FIG. 2F, the variable aperture 246 may be formed by the choreographed movement of more than two plates, such as the four plates 2471-2474 herein the illustrated embodiment, each of the plates 2471-2474 has a one-quarter circle opening.

Further details on selected embodiments are disclosed below.

Turning again to FIG. 2B, each of the plates 244/245 has an opening on its edge, wherein both the size and the shape of each opening correspond to a portion of the variable aperture 246. Moreover, the first plate 244 and the second plate 245 are respectively coupled with different portions of linear bearings 247, such that the first plate 244 and the second plate 245 can be respectively moved along the first arm 262 and the second arm 263. Significantly, the overlap of the openings on the plates 244/245 decides the shape and the size of the variable aperture 246. By respectively moving one or more of the first plate 244 and the second plate 245, the relative geometric relation of the openings is adjusted whereby the variable aperture 246 is adjusted.

A perspective on adjustment of (e.g., how to adjust) the variable aperture 246 can be discerned by comparing FIG. 2B and FIG. 2C. As shown in FIG. 2B, due to the two plates 244/245 being almost overlapped with each other, the size of the variable aperture 246 is relatively small. Here, because the shape of each opening is a portion of a circle, the shape of the variable aperture 246 is decided by two opposing relatively small (e.g., owing to the large overlap) arcs. In contrast, as shown in FIG. 2C, a different relative geometric relation (e.g., less overlapping) between the plates 244/245 is obtained, for example, by increasing the distance between the plates 244/245. Then, both the size and the shape of the variable aperture 246 are correspondingly changed (e.g., increased) by operation of the changed (e.g., enlarged) sizes of the two opposing arcs.

The driving assembly 250 (FIG. 2E) for adjusting the aperture assembly 240 in general can be used in particular for adjusting the relative geometric relation between the plates 244/245. For instance, a cable 252 of the driving assembly 250 can be respectively connected with the first plate 244 and the second plate 245, and also disposed between pulleys 253 for (e.g., capable of) facilitating changing of the moving direction of the cable 252. Here, the connections among the cable 252 and the plates 244/245 are arranged to allow the first plate 244 and the second plate 245 to be respectively moved. The block 251 can be used to deliver the required motion (e.g., to move the cable 252). For example, the block 251 can be located inside the outer shaft 2611 and attached to the inner shaft 2612 (FIG. 2C), such that the plates 244/245 are driven by the cable 252 when the inner shaft 2612 moves up and down to thereby effectuate the motion. Furthermore, to flexibly adjust the movement of the plates 244/245, such as the moving velocity of the plates 244/245, the driving assembly 250 can include a spring 258 for adjusting a tension of the cable 252.

Note that the driving assembly 250 is not limited to the example mentioned above. The driving assembly 250 can comprise other hardware capable of moving one or more of the plates 244/245, or capable of adjusting the relative geometric relation among different portions of the aperture assembly 240 for adjusting one or more of a size and a shape of the variable aperture 246. For example, the driving assembly 250 may be a combination of the rack and the gear. Herein, the gear can drive any of the plates 244/245 along the rack.

Of course, an actuator assembly (such as a motor) is required to provide the required motion for adjusting the variable aperture 246, even to rotate/move the aperture assembly 240. As with the prior art of FIG. 1C, in which plate 133 with fixed aperture 134 can be moved and/or rotated, the actuator assembly may be located outside the implantation chamber for minimizing contamination such as particle contamination or heat contamination. A transmission device (such as a gear, shaft, and/or screw type) is used to deliver the required motion from the actuator assembly to the aperture driving assembly 260, and/or even the driving assembly 250. Similarly, to minimize contamination, the transmission device typically can be located inside the shaft 261 or covered by an insulator. Within reason, suffice it to say that any conventional technology suitable for the prior-art construction shown in FIG. 1B can be used to provide and deliver the required motion, and thus such related details are not further discussed.

Accordingly, a main characteristic of these embodiments can be characterized as the variable aperture 264. In other words, a primary difference between these embodiments and the prior art is that the shape/size of the aperture is variable in the embodiments but is fixed in the prior art. The particular approach for forming this variable aperture does not need to be the main focus/characteristic of the embodiments since it can be achieved by many different approaches.

For example, referring again to FIG. 2F, each of the four plates 2471, 2472, 2473 and 247 of the aperture assembly can have a triangle shape with the prevision (e.g., shape) of a quarter-circle opening. Indisputably, by adjusting the relative geometric relation among any two (e.g., or more) of the plates 2471-2474, especially by adjusting the relative distance between any two opposing ones of the plates 2471-2474, both the shape and the size of the variable aperture 246 surrounded (e.g., defined) by the plates 2471-2474 can be flexibly adjusted. Here, each of the plates 2471-2474 also can be coupled to a respective arm by respective linear bearings, whereby one or more of these plates 2471-2474 can be moved along the arms and/or moved/rotated with the arms as discussed in the previous examples.

In addition to minimized contamination, the material of the plates capable of forming the variable aperture typically can be graphite or a similar material for decreasing the particle contamination induced by collisions between the ion beam 20 and the plates 244/245.

Note that with the fixed aperture being well-known, many details of the aperture are omitted as a consequence of not being main characteristics of the invention, no matter whether the aperture is fixed or variable. For example, such details may include the preferred shape of the variable aperture, how to move and/or rotate the aperture assembly with the variable assembly, how to combine the effect of the variable aperture with the effect of the conventional magnetic field, and so on.

Figure 3:
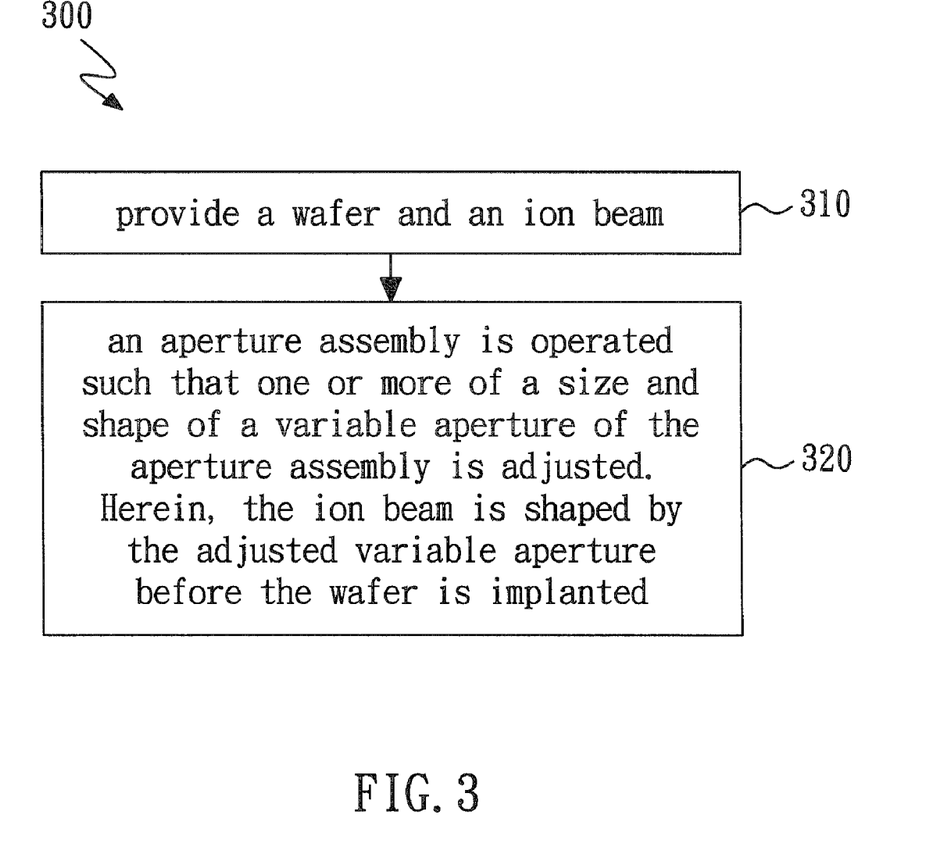
FIG. 3 is a flow diagram of an ion implant method in accordance with an embodiment of the present invention.

FIG. 3 shows a flow diagram of an ion implant method 300 in accordance with an embodiment of the present invention. The ion implant method 300 begins at step 310 with the provision of a wafer and an ion beam. Then, at step 320, an aperture assembly is operated such that one or more of a size and shape of a variable aperture of the aperture assembly is adjusted. Herein, the ion beam is shaped by the adjusted variable aperture before the wafer is implanted.

In this embodiment, details on adjusting the variable aperture are essentially similar to those elucidated in the above discussions. Hence, to avoid repetition only portions of those contents are abbreviated below:

(a) Optionally moving the variable aperture along a first direction intersecting the ion beam.

(b) Optionally rotating the variable aperture around a second direction intersecting the ion beam.

(c) When the aperture assembly has two or more plates, each with an opening located on an edge and corresponding to (e.g., forming) at least a portion of the variable aperture, the variable aperture is adjusted by changing a relative geometric relation among one or more of the plates.

(d) When the aperture assembly has two or more plates, each with an opening located on an edge and corresponding to (e.g., forming) at least a portion of the variable aperture, the variable aperture is adjusted by moving one or more (e.g., each) of the plates along a (e.g., an individual) direction.

(e) When the aperture assembly has two or more plates, each corresponding to (e.g., defining) at least a portion of the variable aperture, the variable aperture is adjusted by changing a relative geometric relation among one or more of the plates.

(f) When the aperture assembly has at least two plates, each of which corresponds to (e.g., defines) at least a portion of the variable aperture, the variable aperture is adjusted by moving one or more (e.g., each) of the plates along a (e.g., an individual) direction.

Use of the inventive implanter and implant method allows the ion beam to be flexibly shaped before a wafer is implanted via a variable aperture with a readily and dynamically (e.g., variably) adjustable shape/size. Hence, besides the potential adjustability achieved by rotating and/or moving the variable aperture as the conventional fixed aperture, the proposed implanter/method can achieve an altogether enhanced and/or different variable range of sizes/shapes of the shaped ion beam. Moreover, as discussed above, the flexible adjustment of the variable aperture can be achieved by way of simple mechanical devices and mechanical motions. Most if not all potential applications of the conventional fixed-aperture can be more effectively and economically achieved by the proposed variable aperture.

Although specific embodiments have been illustrated and described, it will be appreciated by those skilled in the art that various modifications may be made without departing from the scope of the present invention, which is intended to be limited solely by the appended claims.

What is claimed is:

1. An ion implanter, comprising:
   an ion source used to provide an ion beam;
   a holder used to hold a wafer to be implanted;
   an aperture assembly having a variable aperture, wherein said aperture assembly is used to shape said ion beam before said wafer is implanted by shaped said ion beam, and wherein one or more of size and shape of said variable aperture of said aperture assembly is adjusted so that one or more of size and shape of said ion beam is changed when said ion beam passes through said variable aperture; and
   an aperture driving assembly used to adjust a relative geometric relation between said aperture assembly and said ion beam, said aperture driving assembly comprising a shaft and at least one arm, wherein said shaft is connected with a chamber wall surrounding both said holder and said aperture assembly, each said arm is connected to said shaft respectively, and said aperture assembly is disposed on each said arm, and wherein said shaft is used to move said aperture assembly along a specific direction different than the direction of said ion beam, and said shaft is used to rotate said aperture assembly around said shaft.

2. The ion implanter as set forth in claim 1, wherein a position of said aperture assembly is selected from the following:
   between said ion source and a mass analyzer used to analyze said ion beam so that a plurality of ions with undesired charge-to-mass ratios are moved away from said ion beam;
   inside said mass analyzer;
   between said mass analyzer and said holder;
   between said mass analyzer and one or more magnets used to apply one or more magnetic fields for adjusting the motion trajectories of ions of said ion beam; and
   between said holder and said magnets.

3. The ion implanter as set forth in claim 1, wherein said aperture driving assembly is capable of performing at least one of the following:
   moving said aperture assembly along a first direction intersecting with said ion beam; and
   rotating said aperture assembly along a second direction intersecting with said ion beam.

4. The ion implanter as set forth in claim 1, wherein said variable aperture can be adjusted by moving different portions of said aperture assembly respectively.

5. The ion implanter as set forth in claim 1, wherein said aperture assembly comprises at least two plates, each of said plates defining a portion of said variable aperture.

6. The ion implanter as set forth in claim 5, a configurability of said plates being characterized by one or more of:
   one or more of said plates having an opening on an edge of said plate, each opening corresponding to at least a portion of said variable aperture; and
   one or more of said plates having no opening on any edge of said plate, wherein at least an edge of said plate corresponds to at least a portion of said variable aperture.

7. The ion implanter as set forth in claim 5, wherein said aperture assembly comprises a driving assembly capable of adjusting a relative position among said plates.

8. The ion implanter as set forth in claim 7, wherein said aperture assembly comprises a driving assembly capable of moving each said plate along an individual direction.

9. The ion implanter as set forth in claim 7, wherein said driving assembly comprises a cable and a cable actuator, said cable being connected with said plates and said cable actuator being capable of driving said cable to move one or more of said plates.

10. The ion implanter as set forth in claim 9, wherein said driving assembly further comprises a spring for adjusting a tension of said cable.

11. The ion implanter as set forth in claim 7, wherein said driving assembly comprises at least one rack and at least one gear for moving said plates, and wherein said plates are able to be moved along said racks by said gears.

12. The ion implanter as set forth in claim 7, wherein said driving assembly comprises at least one linear bearing for guiding said plates to move.

13. The ion implanter as set forth in claim 1, further comprising an actuator assembly located outside a chamber wall enclosing said aperture assembly, said actuator assembly being capable of providing motion required to adjust said aperture assembly.

14. An ion implant method, comprising:
   providing a wafer and an ion beam; and
   operating an aperture assembly to shape said ion beam before said wafer is implanted by shaped said ion beam, wherein one or more of size and shape of a variable aperture of said aperture assembly is adjusted so that one or more of size and shape of said ion beam is changed when said ion beam passes through said variable aperture, and wherein an aperture driving assembly is used to adjust a relative geometric relation between said aperture assembly and said ion beam, said aperture driving assembly comprises a shaft and at least one arm, said shaft is connected with a chamber wall surrounding both said holder and said aperture assembly, each said arm is connected to said shaft respectively, said aperture assembly is disposed on each said arm, said shaft is used to move said aperture assembly along a specific direction different than the direction of said ion beam, and said shaft is used to rotate said aperture assembly around said shaft.

15. The ion implant method as set forth in claim 14, wherein, a position of said aperture assembly is selected from one or more of the following;
   between an ion source capable of providing said ion beam and a mass analyzer capable of analyzing said ion beam so that a plurality of ions with un-desired charge-to-mass ratios are moved away from said ion beam;
   inside said mass analyzer; and
   between said mass analyzer and a holder capable of holding said wafer.

16. The ion implant method as set forth in claim 14, further comprising one or more of the following:
   moving said variable aperture along a first direction intersecting with said ion beam; and
   rotating said variable aperture around a second direction intersecting with over said ion beam.

17. The ion implant method as set forth in claim 14, said aperture assembly having two or more plates each with one of (a) an edge and (b) an edge with an opening, corresponding to at least a portion of said variable aperture, said variable aperture being adjusted by adjusting a relative geometric relation among said plates.

18. The ion implanter as set forth in claim 17, further comprising structure adapted to move each said plate along an individual direction.

19. The ion implanter as set forth in claim 1, wherein said shaft is a combination of an outer shaft and an inner shaft, and wherein said outer shaft is concentrically located, with respect to said inner shaft, each said arm is directly fixed on said outer shaft, said aperture assembly is rotated when said outer shaft is driven to rotate relative to said inner shaft, said aperture assembly is translated when said outer shaft is driven to move longitudinally, and said aperture assembly is translated when said inner shaft is extended or retracted relative to said outer shaft.

* * * * *